United States Patent
Hamada et al.

(10) Patent No.: US 10,952,326 B2
(45) Date of Patent: Mar. 16, 2021

(54) PRINTED WIRING BOARD AND SWITCHING REGULATOR

(71) Applicant: Murata Manufacturing Co., Ltd., Kyoto-fu (JP)

(72) Inventors: Akinori Hamada, Nagaokakyo (JP); Yoshimasa Yoshioka, Nagaokakyo (JP); Yoshinori Taguchi, Nagaokakyo (JP); Ryuichiro Tominaga, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/860,821

(22) Filed: Apr. 28, 2020

(65) Prior Publication Data

US 2020/0260584 A1    Aug. 13, 2020

Related U.S. Application Data

(63) Continuation of application No. 15/892,243, filed on Feb. 8, 2018, now Pat. No. 10,694,622.

(30) Foreign Application Priority Data

Apr. 20, 2017    (JP) .................. 2017-083661

(51) Int. Cl.
*H02M 3/00*    (2006.01)
*H05K 1/16*    (2006.01)
(Continued)

(52) U.S. Cl.
CPC ......... *H05K 1/165* (2013.01); *H01F 17/0013* (2013.01); *H01F 17/04* (2013.01);
(Continued)

(58) Field of Classification Search
CPC ........ H02M 3/00; H02M 3/155; H05K 1/165; H05K 1/183; H05K 1/185; H01F 27/24;
(Continued)

(56) References Cited

U.S. PATENT DOCUMENTS 6,996,892 B1    2/2006 Dening et al.
9,853,003 B1 *   12/2017 Han .................... H01L 23/3128
(Continued)

FOREIGN PATENT DOCUMENTS

CN    102270624 A    12/2011
CN    106298160 A    1/2017
(Continued)

OTHER PUBLICATIONS

An Office Action mailed by the China National Intellectual Property Administration dated Jun. 24, 2020, which corresponds to Chinese Patent Application No. 201810208782.6 and is related to U.S. Appl. No. 16/860,821 with English language translation.
(Continued)

*Primary Examiner* — Hoa C Nguyen
(74) *Attorney, Agent, or Firm* — Studebaker & Brackett PC

(57) ABSTRACT

A printed wiring board comprises a sheet-shaped core base material containing a magnetic material, a coil disposed inside the core base material, and an external circuit layer disposed on at least one of first and second surfaces of the core base material opposite to each other.

16 Claims, 14 Drawing Sheets

(51) Int. Cl.
*H01F 27/24* (2006.01)
*H05K 1/18* (2006.01)
*H01F 27/28* (2006.01)
*H05K 3/46* (2006.01)
*H01F 41/04* (2006.01)
*H02M 3/155* (2006.01)
*H01F 17/04* (2006.01)
*H01F 17/00* (2006.01)

(52) U.S. Cl.
CPC ......... *H01F 27/24* (2013.01); *H01F 27/2804* (2013.01); *H01F 41/043* (2013.01); *H02M 3/00* (2013.01); *H02M 3/155* (2013.01); *H05K 1/18* (2013.01); *H05K 3/4652* (2013.01); *H05K 3/4682* (2013.01); *H01F 2017/048* (2013.01); *H01F 2027/2809* (2013.01); *H05K 3/4676* (2013.01); *H05K 2201/0215* (2013.01); *H05K 2201/086* (2013.01); *H05K 2201/10015* (2013.01); *H05K 2201/10053* (2013.01)

(58) Field of Classification Search
CPC . H01F 27/2804; H01F 27/2809; H01F 41/043
See application file for complete search history.

(56) References Cited

U.S. PATENT DOCUMENTS

| | | | |
|---|---|---|---|
| 2009/0103272 A1 | 4/2009 | Watanabe | |
| 2010/0176908 A1 | 7/2010 | Mori | |
| 2011/0297425 A1 | 12/2011 | Nakamura et al. | |
| 2014/0043196 A1* | 2/2014 | Gouchi | H01Q 1/2225 343/788 |
| 2014/0225701 A1* | 8/2014 | Morita | H01F 17/0013 336/200 |
| 2015/0173197 A1 | 6/2015 | Cho et al. | |
| 2015/0302974 A1 | 10/2015 | Zhao et al. | |
| 2015/0371764 A1* | 12/2015 | Gordin | H01F 41/041 336/225 |
| 2016/0093431 A1 | 3/2016 | Quilici | |
| 2016/0141236 A1 | 5/2016 | Kurita | |
| 2016/0284462 A1* | 9/2016 | Ahn | H01F 27/06 |
| 2016/0372259 A1 | 12/2016 | Banba et al. | |
| 2016/0379746 A1 | 12/2016 | Yoshioka et al. | |
| 2017/0018349 A1* | 1/2017 | Otsubo | H01F 17/0033 |

FOREIGN PATENT DOCUMENTS

| | | |
|---|---|---|
| JP | 2003-078251 A | 3/2003 |
| JP | 2004-200439 A | 7/2004 |
| JP | 2005-183890 A | 7/2005 |
| JP | 2007173713 A | 7/2007 |
| JP | 2014-027212 A | 2/2014 |
| JP | 2016-096292 A | 5/2016 |
| JP | 2016-197624 A | 11/2016 |
| JP | 2017-017103 A | 1/2017 |
| JP | 2017-017298 A | 1/2017 |
| WO | 2017-006784 A1 | 1/2017 |

OTHER PUBLICATIONS

An Office Action; "Notification of Reasons for Refusal," Mailed by the Japanese Patent Office dated Jun. 18, 2019, which corresponds to Japanese Patent Application No. 2017-083661 and is related to U.S. Appl. No. 15/892,243; with English language translation.

An Office Action; "Notification of Reasons for Refusal," Mailed by the Japanese Patent Office dated Oct. 1, 2019, which corresponds to Japanese Patent Application No. 2017-083661 and is related to U.S. Appl. No. 15/892,243; with English language translation.

An Office Action mailed by the Japanese Patent Office dated Feb. 4, 2020, which corresponds to Japanese Patent Application No. 2017-083661 and is related to U.S. Appl. No. 15/892,243; with English language translation.

An Office Action issued by the China National Intellectual Property Administration dated Nov. 2, 2020, which corresponds to Chinese Patent Application No. 201810208782.6 and is related to U.S. Appl. No. 16/860,821 with English language translation.

* cited by examiner

PRINTED WIRING BOARD AND SWITCHING REGULATOR

CROSS REFERENCE TO RELATED APPLICATION

This application is a continuation of U.S. application Ser. No. 15/892,243 filed Feb. 8, 2018, which claims benefit of priority to Japanese Patent Application 2017-083661 filed Apr. 20, 2017, the entire content of which is incorporated herein by reference.

BACKGROUND

Technical Field

The present disclosure relates to a printed wiring board and a switching regulator.

Background Art

Recently, because of miniaturization and higher functionality of electronic devices, it is required to reduce the number of components in terms of electronic components mounted on an electronic circuit board. Therefore, techniques are under development for incorporating electronic components such as inductance elements and capacitance elements in electronic circuit boards.

The techniques are particularly important for IVRs (Integrated Voltage Regulators) having a power source management circuit incorporated in a logical operation element such as a CPU, since an LC ripple filter in a switching regulator circuit is disposed near a load for the purpose of improving efficiency. Especially, a problem is to incorporate an inductor having a relatively large size with respect to a capacitor element.

Conventional electronic circuit boards include a printed wiring board described in Japanese Laid-Open Patent Publication No. 2016-197624. This printed wiring board has a mounting board and an inductor component embedded in a hole of the mounting board.

SUMMARY

However, in the conventional printed wiring board, the mounting board must has the thickness made thicker than the thickness of the inductor component so as to absorb variations in the thickness of the inductor component. Therefore, the printed wiring board becomes thicker and cannot be reduced in thickness.

Therefore, a problem to be solved by the present disclosure is to provide a printed wiring board and a switching regulator capable of reducing thickness of an electronic device.

In view of the above problem, a printed wiring board according to an embodiment of the present disclosure comprises a sheet-shaped core base material containing a magnetic material, a coil disposed inside the core base material, and an external circuit layer disposed on at least one of first and second surfaces of the core base material opposite to each other.

The core base material is a portion serving as a core material of the printed wiring board and is distinguished from a functional layer disposed on another core material or a portion disposed inside another core material. The external circuit layer is a layer in which a circuit for connecting terminals of an electric element is formed so as to achieve a desired electric circuit, and includes an external insulating layer disposed outside the core base material, an external board wiring, and an electronic component mounting land, for example. Particularly, the external circuit layer is different from an external electrode serving as a terminal of the electronic component and a lead-out wiring connecting an internal electrode and an external electrode serving as a functional part of the electronic component.

According to the printed wiring board of the present disclosure, an inductor function is incorporated in the core base material. Therefore, the printed wiring board of the present disclosure eliminates the need for mounting or incorporating an inductor component and can be reduced in thickness beyond the range conventionally defined by the inductor component. Since the core base material contains a magnetic material, a desired inductance can be acquired from the thinner and smaller coil, and the coil can be incorporated even though the core base material has a sheet shape. Since the external circuit layer is directly disposed on the core base material having the inductor function, the core base material can simultaneously play a role of a conventional mounting board. Consequently, it is not necessary to separately prepare the core base material of the mounting board and the core of the inductor component as in the conventional case, and the thickness of the electronic device can be reduced.

In an embodiment of the printed wiring board, the external circuit layer includes an external board wiring not connected to the coil. According to the embodiment, since the wiring connecting electric elements other than the built-in coil is incorporated, the electronic device can be made thinner and smaller.

In an embodiment of the printed wiring board, the core base material has a closed magnetic circuit in which a magnetic flux generated by the coil circulates. According to the embodiment, a high inductance value can be achieved with reduced size and thickness. Additionally, a leakage of the magnetic flux generated by the coil to the outside of the core base material can be reduced, and noises can be suppressed.

In an embodiment of the printed wiring board, the shape of the coil is a spiral shape. The "spiral shape" is a curve (two-dimensional curve) shape formed in a planar shape and may be a curve shape with the number of turns less than one or may partly include a linear shape.

In an embodiment of the printed wiring board, the shape of the coil is a helical shape. The "helical shape" is a helix (three-dimensional helix) advancing in an axial direction while maintaining substantially the same diameter. In an embodiment of the printed wiring board, the shape of the coil is a linear shape.

In an embodiment of the printed wiring board, the external circuit layer includes an external insulating layer laminated on the first surface or the second surface of the core base material. According to the embodiment, since the first surface or the second surface of the core base material is covered with the external insulating layer, an electric leakage from the external circuit layer to the core base material can be prevented.

In an embodiment of the printed wiring board, the external insulating layer contains a glass cloth. According to the embodiment, since the external insulating layer contains a glass cloth, the printed wiring board can be improved in strength and restrained from warping.

In an embodiment of the printed wiring board, the core base material is made of a composite material of a metal magnetic filler and a resin. The metal magnetic filler is Fe or an Fe alloy (such as FeSi, FeCo, and FeAl alloys), for example, and the resin is a resin material such as epoxy, for example. According to the embodiment, since the core base material is made of a composite material of a metal magnetic filler and a resin, an appropriate inductance can inexpensively be ensured.

In an embodiment of the printed wiring board, the coil is made of a material containing Cu. According to the embodiment, the coil is made of a material containing Cu and is therefore excellent in conductivity.

In an embodiment of the printed wiring board, the coil has multiple coil pattern parts linearly extending along the first surface or the second surface, and a coil via part penetrating the core base material between the multiple coil pattern parts along a first direction in which the first surface and the second surface are opposite. According to the embodiment, the coil constitutes a laminated inductor that can be reduced in thickness and size.

In an embodiment, the printed wiring board further comprises a coil lead-out wiring extending from the multiple coil pattern parts along the first direction and exposed on the first surface or the second surface. According to the embodiment, since the coil lead-out wiring is extended along the first direction, the length of the coil lead-out wiring can be shortened and the resistance can be reduced.

In an embodiment of the printed wiring board, the coil has a conductive part and an insulating film covering the conductive part. According to the embodiment, an electric leakage from a conductor part of the coil to the core base material can be prevented.

In an embodiment, the insulating film is made of a composite material of an insulating non-magnetic filler and a resin. The insulating non-magnetic filler is a silica filler, for example, and the resin is a resin material such as epoxy, for example According to the embodiment, since the insulating film is made of a composite material of an insulating non-magnetic filler and a resin, the insulation can inexpensively be ensured.

In an embodiment of the printed wiring board, the coil has multiple coil pattern parts linearly extending along the first surface or the second surface, and a coil via part penetrating the core base material between the multiple coil pattern parts along a first direction in which the first surface and the second surface are opposite. According to the embodiment, the coil constitutes a laminated inductor that can be reduced in thickness and size.

In an embodiment of the printed wiring board, at least one end of the coil is electrically connected to a portion of the external circuit layer. According to the embodiment, since at least one end of the coil is electrically connected to a portion of the external circuit layer, a board wiring routed from the coil is partially incorporated in the printed wiring board, so that the electronic device can further be reduced in thickness and size.

In an embodiment, the printed wiring board further comprises an internal board wiring disposed inside the core base material and not connected to the coil. According to the embodiment, since the wiring connecting electric elements other than the built-in coil is incorporated, the electronic device can be made thinner and smaller.

In an embodiment of the printed wiring board, the internal board wiring includes multiple wiring pattern parts linearly extending along the first surface or the second surface, and a wiring via part penetrating the core base material between the multiple wiring pattern parts along the first direction in which the first surface and the second surface are opposite. According to the embodiment, the internal board wiring can be made into a printed wiring that can be reduced in thickness and size.

In an embodiment of the printed wiring board, the internal board wiring has a portion conducting from the first surface to the second surface along the first direction. According to the embodiment, since the internal board wiring has a linearly conducting path along the first direction, the resistance of the board wiring can be lowered.

In an embodiment of the printed wiring board, the external circuit layer is disposed on each of the first and second surfaces of the core base material, and the internal board wiring includes a portion electrically connecting the external circuit layer disposed on the first surface and the external circuit layer disposed on the second surface. According to the embodiment, when one of the external circuit layers is grounded, the internal board wiring can be used as a magnetic shield. When one of the external circuit layers is used as a heat sink, the heat generated in the other external circuit layer can be dissipated from the one external circuit layer.

In an embodiment, a switching regulator comprises the printed wiring board; and a capacitor and a switching element electrically connected via the external circuit layer to the coil of the printed wiring board. According to the embodiment, since the printed wiring board of the present disclosure is included, the switching regulator can be made thinner.

According to the printed wiring board and the switching regulator of an embodiment of the present disclosure, the electronic device can be reduced in thickness.

DETAILED DESCRIPTION

An aspect of the present disclosure will now be described in detail with reference to shown embodiments.

First Embodiment (Configuration)

Figure 1:
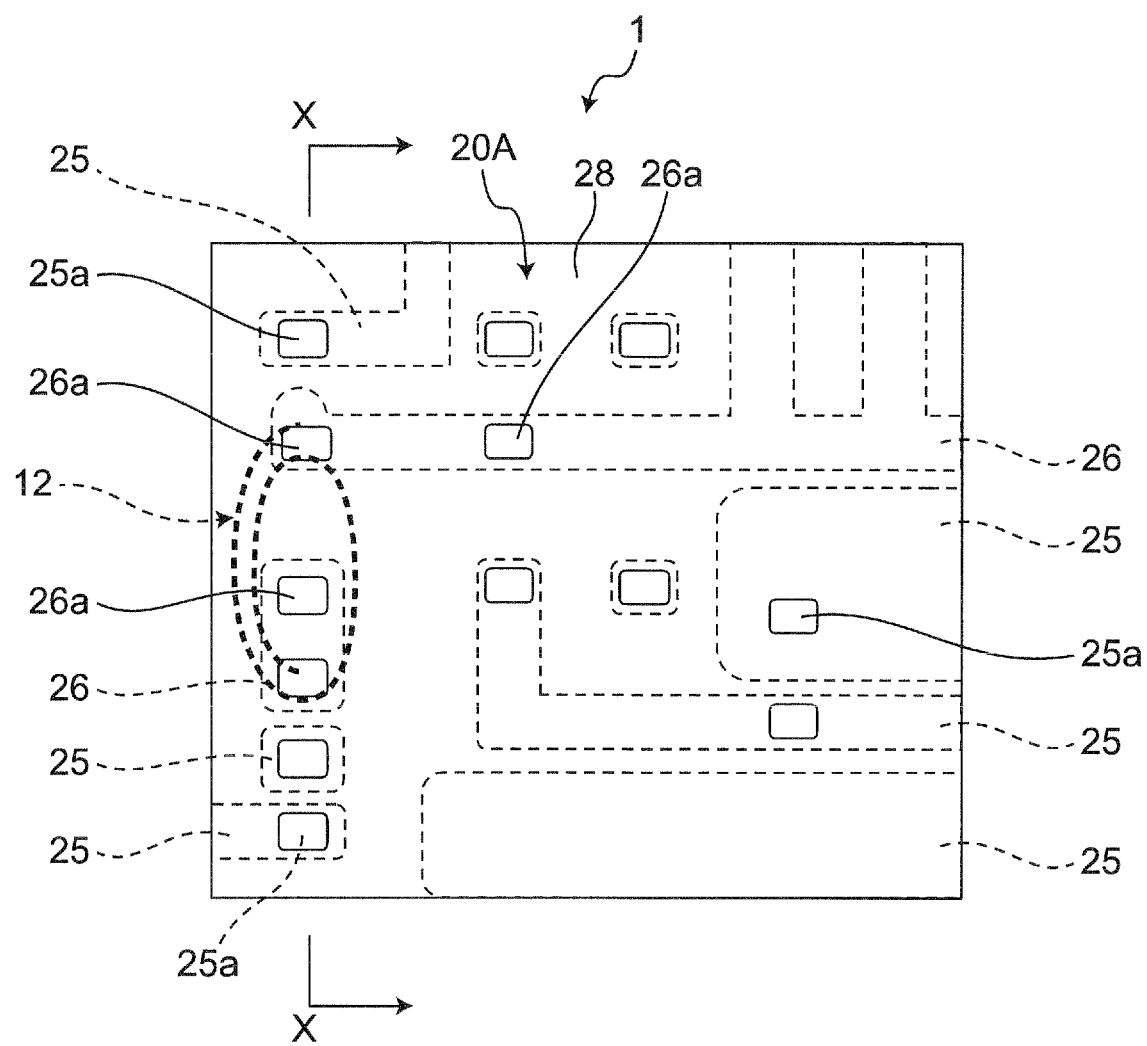
FIG. 1 is a plane view of a first embodiment of a printed wiring board.
Figure 2:
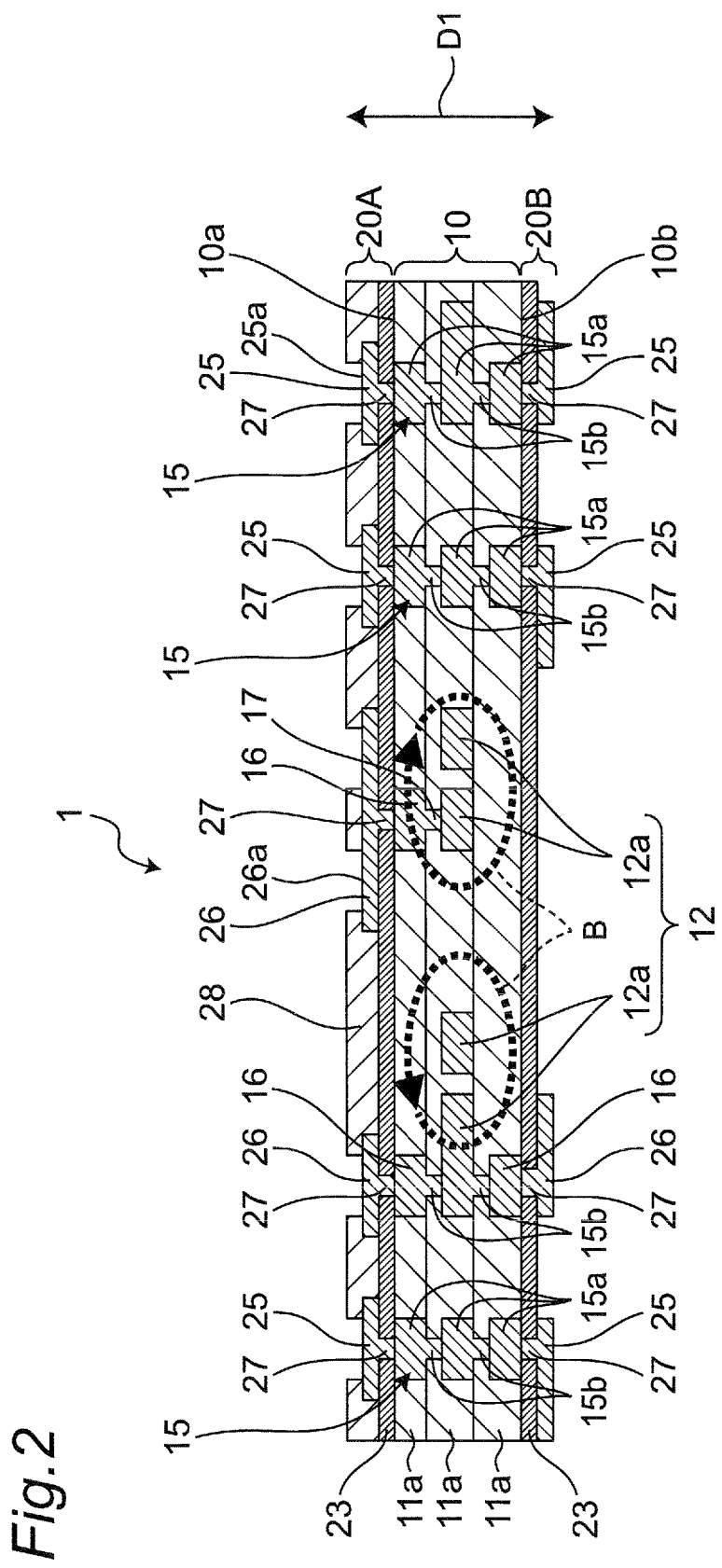
FIG. 2 is a cross-sectional view taken along X-X of FIG. 1.

FIG. 1 is a plane view of a first embodiment of a printed wiring board. FIG. 2 is a cross-sectional view taken along X-X of FIG. 1. As shown in FIGS. 1 and 2, a printed wiring board 1 has a core base material 10, a coil 12 disposed inside the core base material 10, and a first external circuit layer 20A and a second external circuit layer 20B disposed on the core base material. The printed wiring board 1 is mounted on an electronic device such as a personal computer, a DVD player, a digital camera, a TV, a portable telephone, and automotive electronics, for example.

The core base material 10 has a sheet shape containing a magnetic material and has a first surface 10a and a second surface 10b opposite to each other. The first external circuit layer 20A is disposed on the first surface 10a of the core base material 10 and the second external circuit layer 20B is disposed on the second surface 10b of the core base material 10. An opposing direction between the first surface 10a and the second surface 10b will hereinafter be defined as a first direction D1. In this description, it is assumed that the first surface 10a side and the second surface 10b side are the upper side and the lower side, respectively.

The core base material 10 is a core material of the printed wiring board 1 and is made up of multiple magnetic material layers 11a. The multiple magnetic material layers 11a are laminated along the first direction D1. The coil 12 is made up of a single-layer coil pattern part 12a. The core base material 10 is the core material of the printed wiring board and therefore has physical properties capable of achieving the strength, elasticity, warpage characteristics, etc. required for the printed wiring board.

The coil pattern part 12a linearly extends along the first surface 10a or the second surface 10b. The shape of the coil pattern part 12a (the coil 12) is a planar spiral shape as indicated by a dotted line of FIG. 1. The spiral shape is a curve (two-dimensional curve) shape formed in a planar shape and may be a curve shape with the number of turns less than one or may partly include a linear shape.

The core base material 10 has a closed magnetic circuit in which a magnetic flux generated by the coil 12 circulates. The magnetic flux of the coil 12 forms the closed magnetic path as indicated by dotted arrows B of FIG. 2. Therefore, a high inductance value can be achieved with reduced size and thickness. Additionally, a leakage of the magnetic flux generated by the coil 12 to the outside of the core base material 10 can be reduced, and noises can be suppressed. Since the printed wiring board 1 has the core base material 10 including the multiple magnetic material layers 11a, the front and back of the core base material 10 can magnetically be shielded. Therefore, since the core base material 10 also incorporates a magnetic shielding function of suppressing noise propagation between electric circuits, it is not necessary to separately prepare a magnetic shield component, and the electronic device can further be reduced in height and size.

Particular, as in the printed wiring board 1, the core base material 10 preferably includes the magnetic material layers 11a arranged over the entire principal surface thereof and, as a result, the first surface 10a side and the second surface 10b side can entirely magnetically be shielded. In this case, the magnetic material layer 11a may substantially be disposed over the entire principal surface of the core base material 10 and may have a through-hole in a portion due to a coil via part and a wiring via part described later. The magnetic material layers 11a may not all be arranged over the entire principal surface of the core base material 10, and at least one of the magnetic material layers 11a may be arranged over the entire principal surface of the core base material 10.

An internal board wiring 15 not connected to the coil 12 and a coil lead-out wiring 16 connected to the coil 12 are disposed inside the core base material 10. By incorporating the internal board wiring 15 connecting the electric elements other than the built-in coil 12 and incorporating the coil lead-out wiring 16 connected to the coil 12 in this way, the electronic device can be made thinner and smaller.

The internal board wiring 15 includes multiple wiring pattern parts 15a linearly extending along the first surface 10a or the second surface 10b and wiring via parts 15b penetrating the core base material 10 between the multiple wiring pattern parts 15a along the first direction D1. In this way, the internal board wiring 15 can be made into a printed wiring that can be reduced in thickness and size.

The internal board wiring 15 has a portion conducting from the first surface 10a to the second surface 10b along the first direction D1. Since the internal board wiring 15 has a linearly conducting path along the first direction D1 in this way, the resistance of the internal board wiring 15 can be lowered.

An upper end portion of the internal board wiring 15 on the first surface 10a side is electrically connected to the first external circuit layer 20A, and a lower end portion of the internal board wiring 15 on the second surface 10b side is electrically connected to the second external circuit layer 20B. Therefore, when one external circuit layer of the first and second external circuit layers 20A, 20B is grounded, the multiple internal board wirings 15 can be used as a magnetic shield. When one external circuit layer of the first and second external circuit layers 20A, 20B is used as a heat sink, the heat generated in the other external circuit layer of the first and second external circuit layers 20A, 20B can be transferred through the multiple pieces of the internal board wiring 15 and dissipated from the one external circuit layer.

The coil lead-out wiring 16 extends from the coil pattern part 12a along the first direction D1 and is exposed on the first surface 10a or the second surface 10b. The coil lead-out wiring 16 and the coil pattern part 12a are connected via a coil via part 17. Since the coil lead-out wiring 16 is extended along the first direction D1 in this way, the length of the coil lead-out wiring 16 can be shortened and the resistance can be reduced.

The first external circuit layer 20A includes an external insulating layer 23, a first external board wiring 25, a second external board wiring 26, and a protective layer 28. The external insulating layer 23 is laminated on the first surface 10a or the second surface 10b of the core base material 10. As a result, an electric leakage from the first external circuit layer 20A to the core base material 10 can be prevented. The external insulating layer 23 has via holes disposed at predetermined positions overlapping with the internal board wiring 15 and the coil lead-out wiring 16.

The first external board wiring 25 is an external board wiring not connected to the coil 12. Therefore, the first external board wiring 25 is connected to the internal board wiring 15 via a coil via part 27 disposed in the via hole of the external insulating layer 23 overlapping with the internal board wiring 15. Since the wiring 25 connecting the electric elements other than the built-in coil 12 is incorporated in this way, the electronic device can be made thinner and smaller.

The second external board wiring 26 is an external board wiring connected to the coil 12. Therefore, the second external board wiring 26 is connected to the coil lead-out wiring 16 via the coil via part 27 disposed in the via hole of the external insulating layer 23 overlapping with the coil lead-out wiring 16.

The protective layer 28 covers the first and second external board wirings 25, 26 such that predetermined portions of the first and second external board wirings 25, 26 are exposed. The exposed portions of the first and second external board wirings 25, 26 are configured as connection lands 25a, 26a.

Similar to the first external circuit layer 20A, the second external circuit layer 20B includes the external insulating layer 23, the first external board wiring 25, and the second external board wiring 26. However, the second external circuit layer 20B does not include the protective layer 28. The configurations of the external insulating layer 23 and the first and second external board wirings 25, 26 have been described above and therefore will not be described.

A first end of the coil 12 is electrically connected to the second external board wiring 26 of each of the first and second external circuit layers 20A, 20B, and a second end of the coil 12 is electrically connected to the second external board wiring 26 of the first external circuit layer 20A. As a result, portions of the first and second external circuit layers 20A, 20B are made conductive with the coil 12.

According to the printed wiring board 1, an inductor function is incorporated in the core base material 10. Therefore, the printed wiring board 1 eliminates the need for mounting or incorporating an inductor component and can be reduced in thickness beyond the range conventionally defined by the inductor component. Since the core base material 10 contains a magnetic material, a desired inductance can be acquired from the thinner and smaller coil 12, and the coil 12 can be incorporated even though the core base material 10 has a sheet shape. Since the external circuit layers 20A, 20B are directly disposed on the core base material 10 having the inductor function, the core base material 10 can simultaneously play a role of a conventional mounting board. Consequently, it is not necessary to separately prepare the core base material 10 of the mounting board and the core of the inductor component as in the conventional case, and the thickness of the electronic device can be reduced. For example, the size of the printed wiring board 1 can be a square 5 mm on a side and a thickness of 300 to 400 μm.

With regard to a range that can be achieved by the printed wiring board 1, for example, it has been confirmed that 75 μm can be achieved for the core base material by setting the thickness of the coil pattern part to 45 μm and the thickness of each the magnetic layer above and below the coil pattern part to 15 μm. In this case, if the external circuit layer is formed to have, for example, a thickness of about 20 μm, only on either the first surface or the second surface, a printed wiring board having a total thickness of 100 μm or less and the built-in inductor function can be configured, so that a drastic reduction in thickness can be achieved as compared to the conventional techniques.

Specifically, the coil 12 is integrally formed with the core base material 10 and is connected to the first and second external circuit layers 20A, 20B via the coil lead-out wiring 16 and the coil via part 17, so that the thin printed wiring board 1 can be achieved. The first and second external circuit layers 20A, 20B include the external insulating layers and the external board wirings and are different from a configuration made up only of external electrodes of an inductor component. Therefore, the printed wiring board 1 is different from the configuration made up only of an inductor component.

Figure 3:
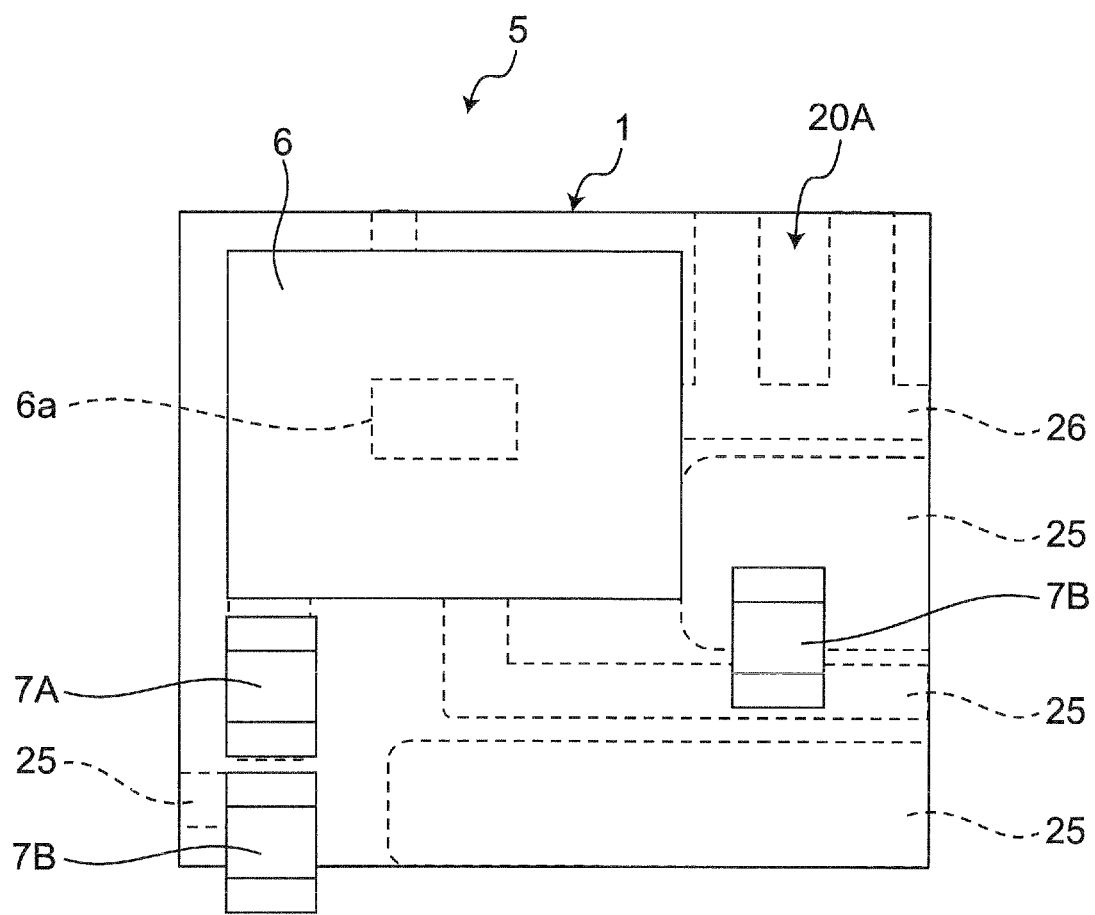
FIG. 3 is a plane view of a switching regulator.

FIG. 3 is a plane view of a switching regulator. As shown in FIG. 3, a switching regulator 5 has the printed wiring board 1 as well as an IC (Integrated Circuit) 6 and first and second capacitors 7A, 7B arranged on the printed wiring board 1. The IC 6 and the first and second capacitors 7A, 7B are disposed on the first external circuit layer 20A of the printed wiring board 1 and are electrically connected to the first external circuit layer 20A. In particular, the IC 6 and the first and second capacitors 7A, 7B are connected via solder to the connection lands 25a, 26a of the first and second external board wirings 25, 26 of the first external circuit layer 20A.

The IC 6 includes a switching element 6a. The switching element 6a is electrically connected to the coil 12 and inputs to the coil 12 a pulse signal that is a rectangular wave having two values of an input voltage and a ground voltage, for example.

The first capacitor 7A is electrically connected to the coil 12 and acts as a smoothing circuit, for example. The second capacitor 7B is connected to the first external board wiring 25 not connected to the coil 12.

Thus, the switching regulator 5 has the printed wiring board 1 described above and therefore can be reduced in thickness. Since the coil 12 of the printed wiring board 1 constitutes a closed magnetic circuit in the core base material 10, the magnetic flux of the coil 12 can suppress propagation of electric and magnetic noises to the external circuit layers 20A, 20B as well as the IC 6 and the first and second capacitors 7A, 7B on the printed wiring board 1.

Particularly, in an IVR, an LC ripple filter in a switching regulator circuit can be disposed near a load by thinning the printed wiring board 1, so that a wiring resistance can be reduced. Furthermore, an inductor to be incorporated can have a relatively large size with respect to a capacitor.

(Material)

The core base material is made of a composite material of a metal magnetic filler and a resin. The metal magnetic filler is Fe or an Fe alloy (such as FeSi, FeCo, and FeAl alloys), for example, and the resin is a resin material such as epoxy, for example Therefore, since the core base material is made of a composite material of a metal magnetic filler and a resin, an appropriate inductance can inexpensively be ensured. Particularly, when the printed wiring board is used for the switching regulator utilized in the IVR, the DC superimposition characteristics of the coil are regarded as important, and therefore, it is desirable for the core base material to use Fe or an iron based alloy such as FeSiCr having good magnetic saturation characteristics as the metal magnetic filler.

The particle diameter of the metal magnetic filler is an average particle diameter of about 1 μm to 100 μm depending on a switching frequency of the switching regulator. To increase the content rate of the metal magnetic filler, a metal magnetic filler having a plurality of different average particle diameters may be mixed. To improve the saturation characteristics of the core base material or to improve the insulation of the core base material, a portion of the metal magnetic filler may be changed to a non-magnetic filler such as $SiO_2$ or $Al_2O_3$, for example.

The coil is made of a material containing Cu and is excellent in conductivity. The coil may be made of a material containing Ag or Au. The internal board wiring, the coil lead-out wiring, the external board wirings, and the coil via parts are made of a material containing Cu, Ag, or Au similar to the coil.

If the external insulating layer contains a glass cloth, the printed wiring board can be improved in strength and restrained from warping. For example, a glass cloth impregnated with an epoxy resin is used for the external insulating layer. Alternatively, a resin such as epoxy having a non-magnetic filler dispersed therein may be used for the external insulating layer and, particularly, if an Fe-base metal filler is dispersed in the core base material, the insulation of the surface of the core base material can be ensured. If the external insulating layer contains carbon fibers, the heat dissipation of the printed wiring board can be improved. The protective layer is a solder resist and applied to a non-soldered portion of the printed wiring board and can prevent a short circuit due to a solder bridge.

(Manufacturing Method)

A manufacturing method of the printed wiring board 1 will be described.

Figure 4A:
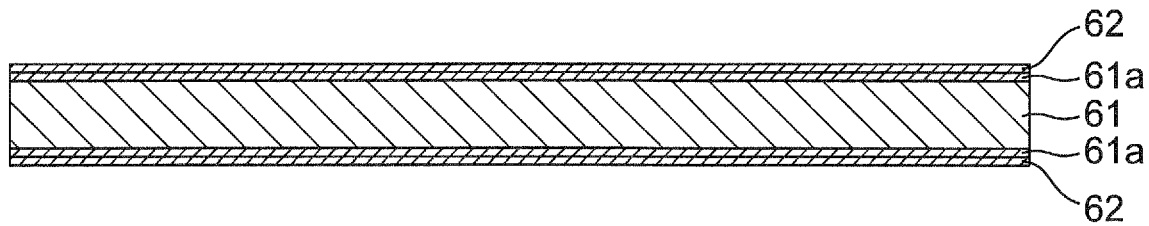
FIG. 4A is an explanatory view for explaining a manufacturing method of the first embodiment of the printed wiring board.

As shown in FIG. 4A, a dummy core substrate 61 is prepared. The dummy core substrate 61 has a substrate copper foil 61a on both sides. In this example, the dummy core substrate 61 is a glass epoxy substrate.

A copper foil 62 is then bonded onto a surface of the substrate copper foil 61a. The copper foil 62 is bonded to a smooth surface of the substrate copper foil 61a. Therefore, an adhesion force can be made weak between the copper foil 62 and the substrate copper foil 61a and, at a subsequent step, the dummy core substrate 61 can easily be peeled from the copper foil 62. Preferably, an adhesive bonding the dummy core substrate 61 and the copper foil 62 is an adhesive with low tackiness. For weakening of the adhesion force between the dummy core substrate 61 and the copper foil 62, it is desirable that the bonding surfaces of the dummy core substrate 61 and the copper foil 62 are glossy surfaces.

Although the subsequent processes can be performed on both sides of the dummy core substrate 61, the processes are performed only on the upper surface in this example for simplicity of description.

Figure 4B:
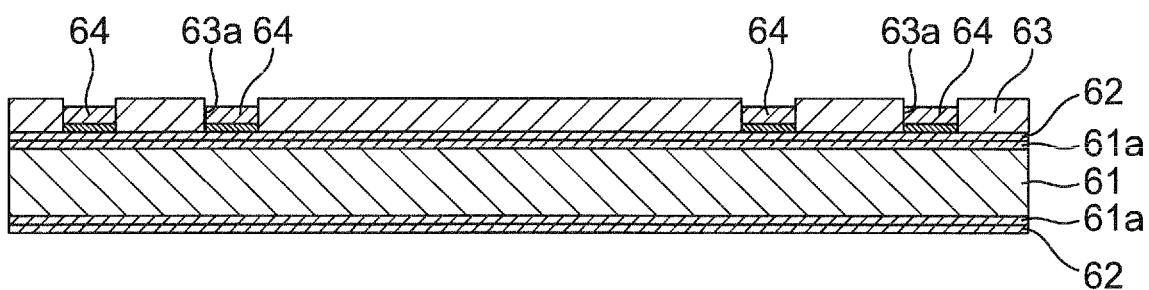
FIG. 4B is an explanatory view for explaining the manufacturing method of the first embodiment of the printed wiring board.

As shown in FIG. 4B, a photosensitive resist layer 63 is formed on the copper foil 62 by using a laminator etc. and then directly exposed to light by a drawing device, a mask aligner, etc. Subsequently, a development process is performed by a spray developing machine etc., and the photosensitive resist layer 63 is patterned to form an opening portion 63a in the photosensitive resist layer 63.

A conductor layer 64 is formed in the opening portion 63a by electroplating etc. In this case, desirably, the copper foil 62 is utilized as a feeding layer of the electroplating, and Ni plating is followed by Cu plating to form the conductor layer 64. This is because the Ni plating is allowed to act as an etching barrier in removal of the copper foil 62 at a subsequent step.

Figure 4C:
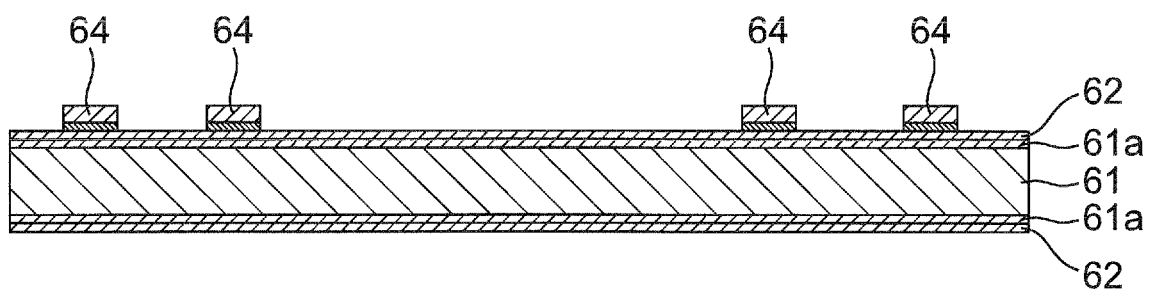
FIG. 4C is an explanatory view for explaining the manufacturing method of the first embodiment of the printed wiring board.
Figure 4D:
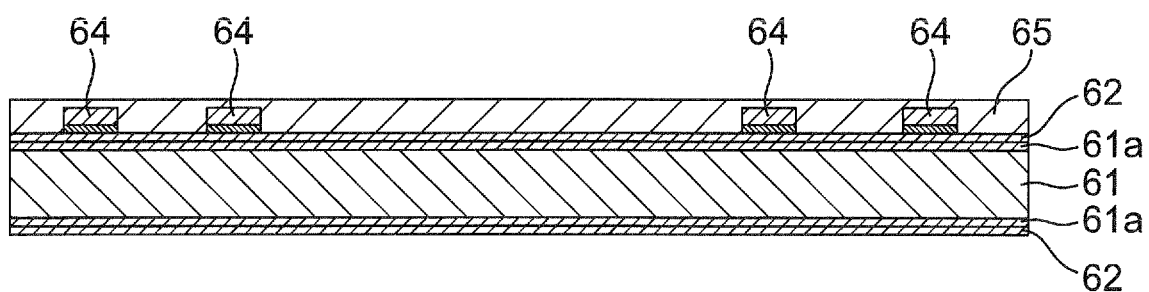
FIG. 4D is an explanatory view for explaining the manufacturing method of the first embodiment of the printed wiring board.

As shown in FIG. 4C, the photosensitive resist layer 63 is removed by using an organic stripping solution. As shown in FIG. 4D, a semi-cured film material having a magnetic filler (metal magnetic filler) dispersed in a resin such as epoxy is laminated by using a vacuum laminator etc. and is then cured by using an oven etc. to acquire a magnetic material layer 65.

Figure 4E:
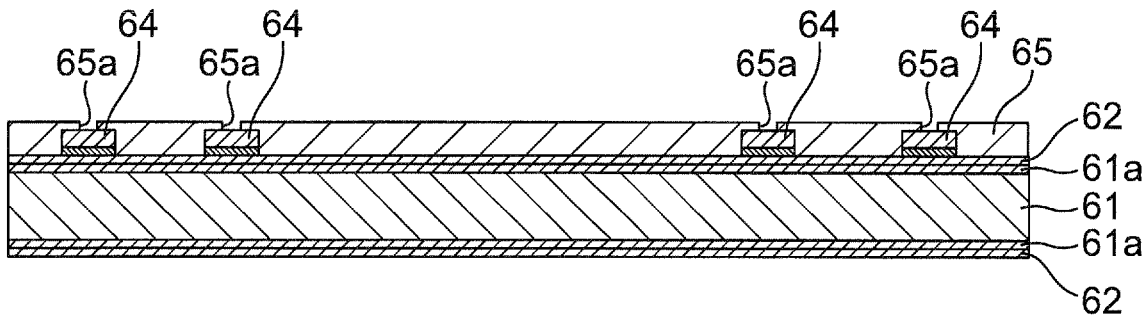
FIG. 4E is an explanatory view for explaining the manufacturing method of the first embodiment of the printed wiring board.
Figure 4F:
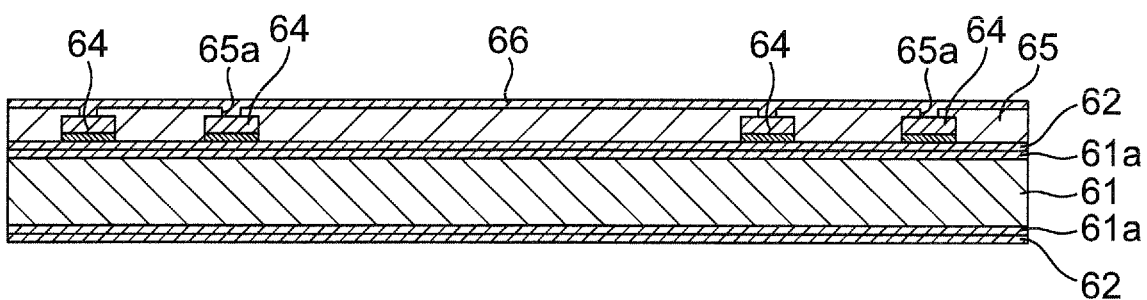
FIG. 4F is an explanatory view for explaining the manufacturing method of the first embodiment of the printed wiring board.

As shown in FIG. 4E, a via hole 65a is disposed in the magnetic material layer 65 by laser processing etc. The via hole 65a is located on the conductor layer 64. As shown in FIG. 4F, a feeding layer 66 is formed on the surface of the magnetic material layer 65 and in the via hole 65a by electroless plating etc.

Figure 4G:
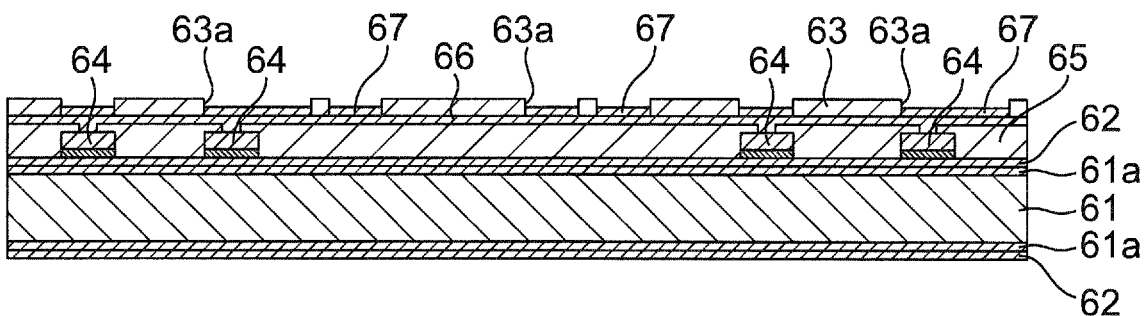
FIG. 4G is an explanatory view for explaining the manufacturing method of the first embodiment of the printed wiring board.
Figure 4H:
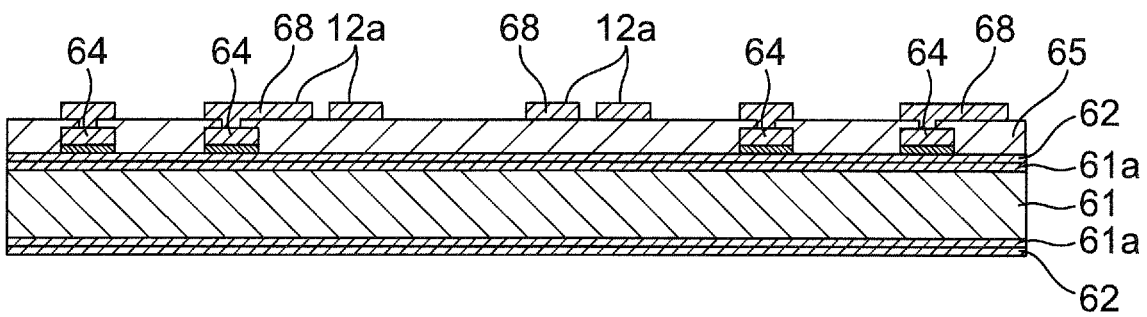
FIG. 4H is an explanatory view for explaining the manufacturing method of the first embodiment of the printed wiring board.

As shown in FIG. 4G, the photosensitive resist layer 63 is formed on the feeding layer 66, and the photosensitive resist layer 63 is patterned to form the opening portion 63a. A conductor layer 67 is then formed in the opening portion 63a by electroplating etc. As shown in FIG. 4H, the photosensitive resist layer 63 is peeled off and the feeding layer 66 is etched to acquire a conductor layer 68. In this example, a portion of wirings formed of the conductor layer 68 is turned in a spiral shape to form the coil pattern part 12a.

Figure 4I:
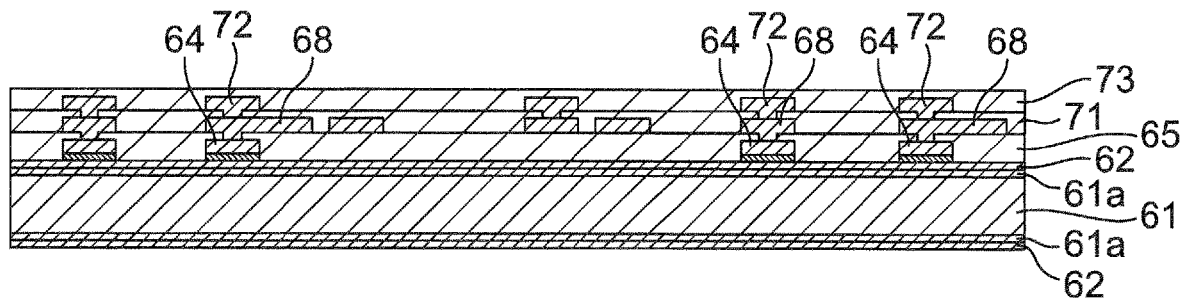
FIG. 4I is an explanatory view for explaining the manufacturing method of the first embodiment of the printed wiring board.

As shown in FIG. 4I, a magnetic material layer 71 and a conductor layer 72 are sequentially acquired by repeating the manufacturing method of FIGS. 4D to 4H. Subsequently, a semi-cured film material having a magnetic filler (metal magnetic filler) dispersed in a resin such as epoxy is laminated by using a vacuum laminator etc. and is then cured by using an oven etc. to acquire a magnetic material layer 73.

Figure 4J:
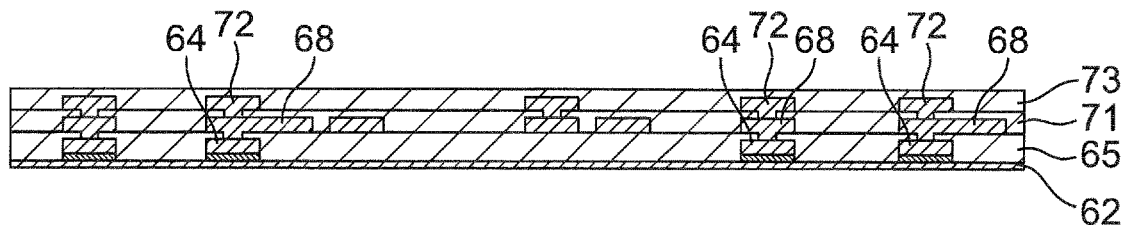
FIG. 4J is an explanatory view for explaining the manufacturing method of the first embodiment of the printed wiring board.
Figure 4K:
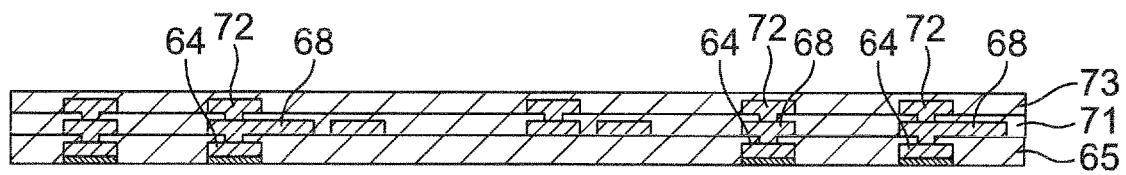
FIG. 4K is an explanatory view for explaining the manufacturing method of the first embodiment of the printed wiring board.
Figure 4L:
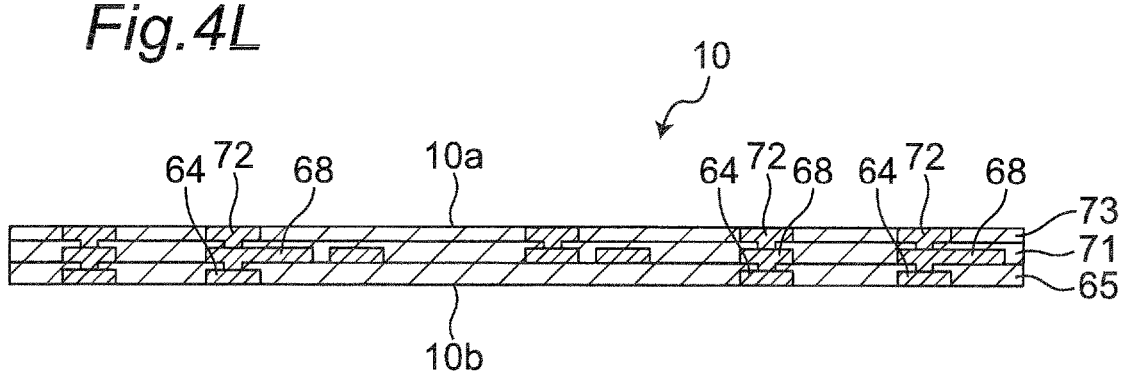
FIG. 4L is an explanatory view for explaining the manufacturing method of the first embodiment of the printed wiring board.

As shown in FIG. 4J, the dummy core substrate 61 is peeled and removed at an interface with the copper foil 62. As shown in FIG. 4K, the copper foil 62 is removed by etching. At this step, the Ni plating of the conductor layer 64 acts as a stopper of the etching and thereby prevents a damage to the Cu plating of the conductor layer 64. As shown in FIG. 4L, grinding and polishing of the upper and lower surfaces are performed by a back grinder, a buff roll, etc. to acquire the desired core base material 10.

Figure 4M:
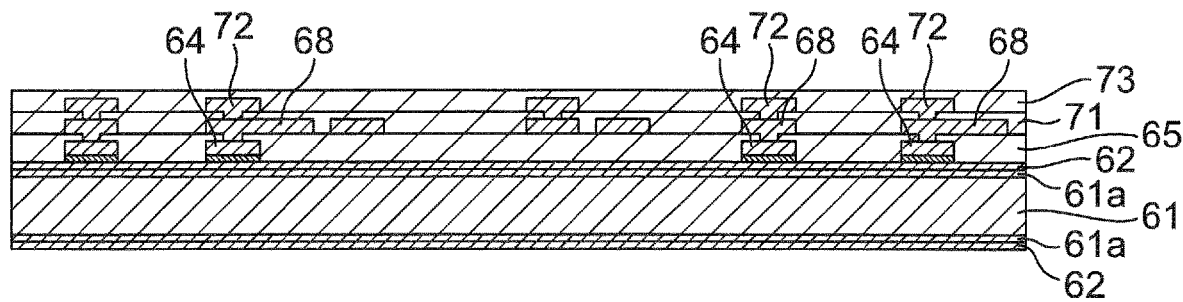
FIG. 4M is an explanatory view for explaining the manufacturing method of the first embodiment of the printed wiring board.

A manufacturing method of subsequently forming an external circuit layer on the core base material 10 to acquire a printed wiring board will be described. As shown in FIG. 4M, the insulating layer 74 is formed on the front and back surfaces (the first surface 10a, the second surface 10b) of the core base material 10 by using a vacuum laminator etc. For the insulating layer 74, a build-up sheet made of an epoxy resin and an inorganic insulating filler may be used, or a prepreg containing a glass cloth or a prepreg containing carbon fibers may be used. If sufficient insulation has been ensured for the core base material 10, this step and the next step of forming via holes may not be included.

Figure 4N:
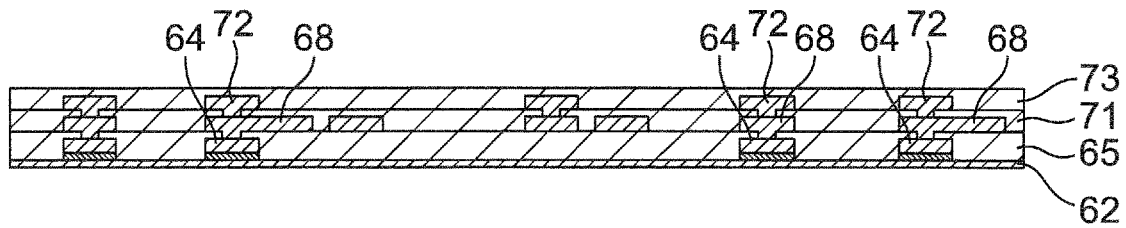
FIG. 4N is an explanatory view for explaining the manufacturing method of the first embodiment of the printed wiring board.

As shown in FIG. 4N, via holes 74a are formed in the insulating layer 74 by laser processing etc. The via holes 74a is disposed to overlap with the predetermined conductor layers 64, 72 electrically connected to the external circuit layer.

Figure 4O:
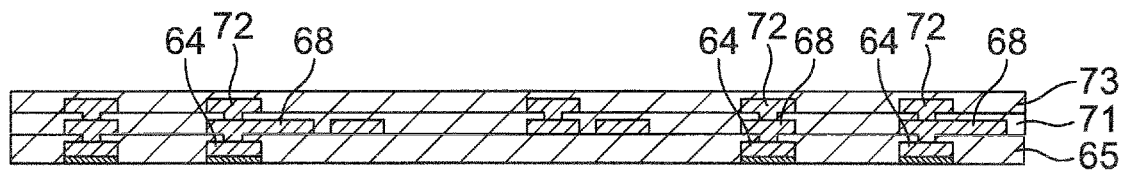
FIG. 4O is an explanatory view for explaining the manufacturing method of the first embodiment of the printed wiring board.
Figure 4P:
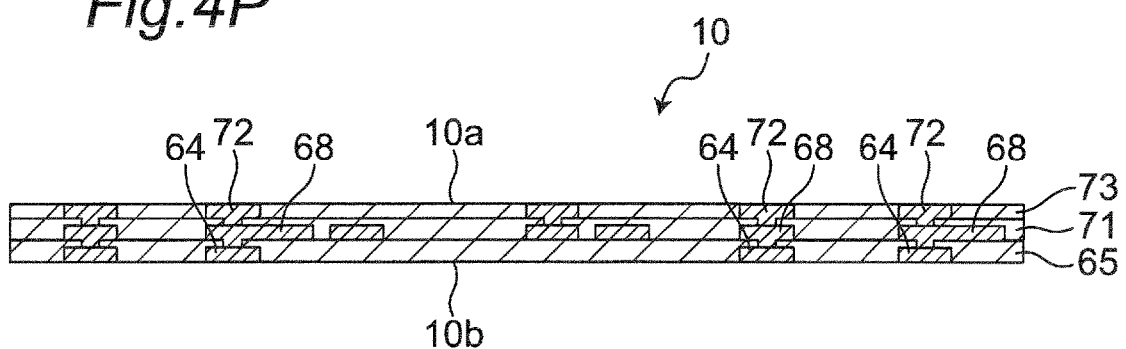
FIG. 4P is an explanatory view for explaining the manufacturing method of the first embodiment of the printed wiring board.

As shown in FIG. 4O, a wiring layer 75 is formed on the insulating layer 74 by a SAP method or a subtract method. As shown in FIG. 4P, a protective layer 76 is disposed such that the wiring layer 75 is partially exposed on the first surface 10a of the core base material 10. The exposed portion of the wiring layer 75 is configured as a connection land. In this way, the first external circuit layer 20A is formed on the first surface 10a of the core base material 10 and the second external circuit layer 20B is formed on the second surface 10b of the core base material 10.

As shown in FIG. 1, the printed wiring board 1 is manufactured. Although only the case of the single external circuit layer is described for simplicity of description in this embodiment, multiple external circuit layers may be formed by repeating this manufacturing method.

Second Embodiment

Figure 5:
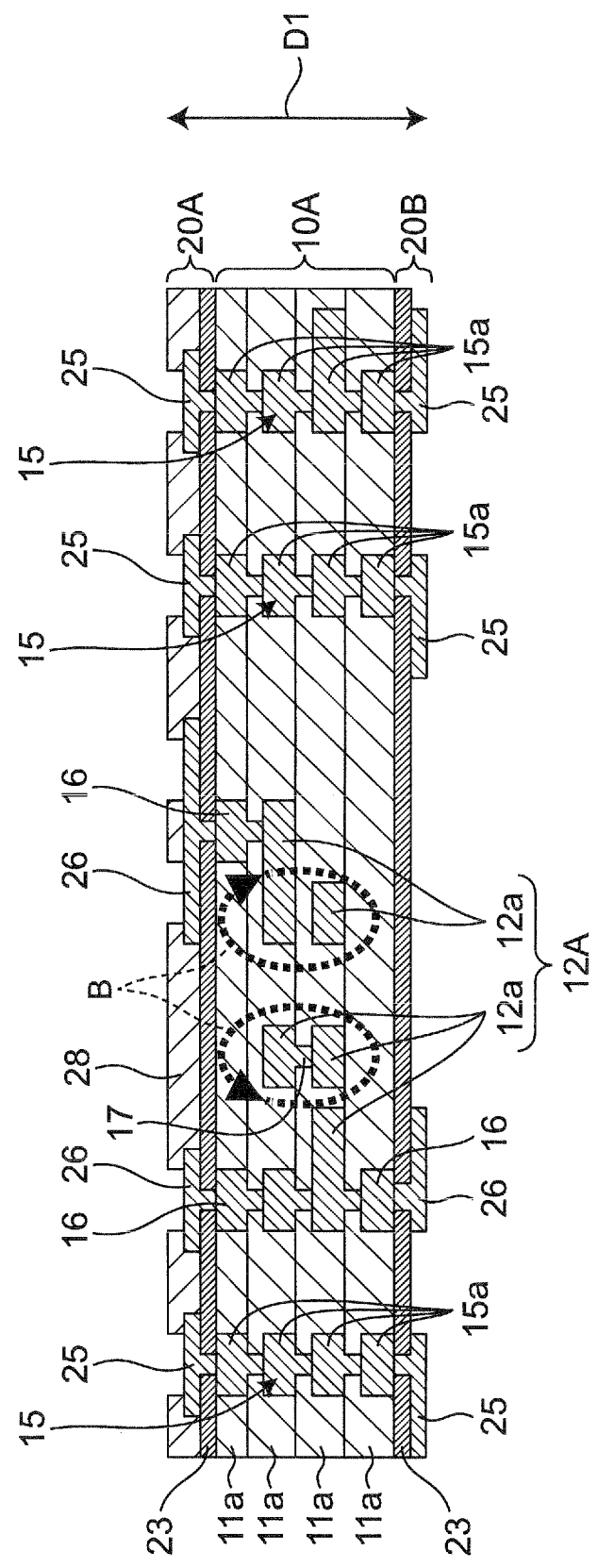
FIG. 5 is a cross-sectional view of a second embodiment of the printed wiring board.

FIG. 5 is a cross-sectional view of a second embodiment of a printed wiring board. The second embodiment is different from the first embodiment only in the configuration of the coil. Only this different configuration will hereinafter be described. In the second embodiment, the same constituent elements as the first embodiment are denoted by the same reference numerals as the first embodiment and therefore will not be described.

As shown in FIG. 5, in a printed wiring board 1A of the second embodiment, a coil 12A has the two-layer coil pattern part 12a and the coil via part 17 connecting the two-layer coil pattern part 12a. The two layers of the coil pattern part 12a each linearly extend along the first surface 10a or the second surface 10b. The coil via part 17 penetrates the core base material 10A between the two layers of the coil pattern part 12a along the first direction D1. The shape of each layer of the coil pattern part 12a is a planar spiral shape. A core base material 10A has a closed magnetic circuit in which the magnetic flux of the coil 12A circulates as indicated by the arrows B.

In the second embodiment, in addition to the effects of the first embodiment, the coil 12A can be configured as a laminated inductor that can be reduced in thickness and size. The coil may be made up of the coil pattern part having three or more layers.

Third Embodiment

Figure 6:
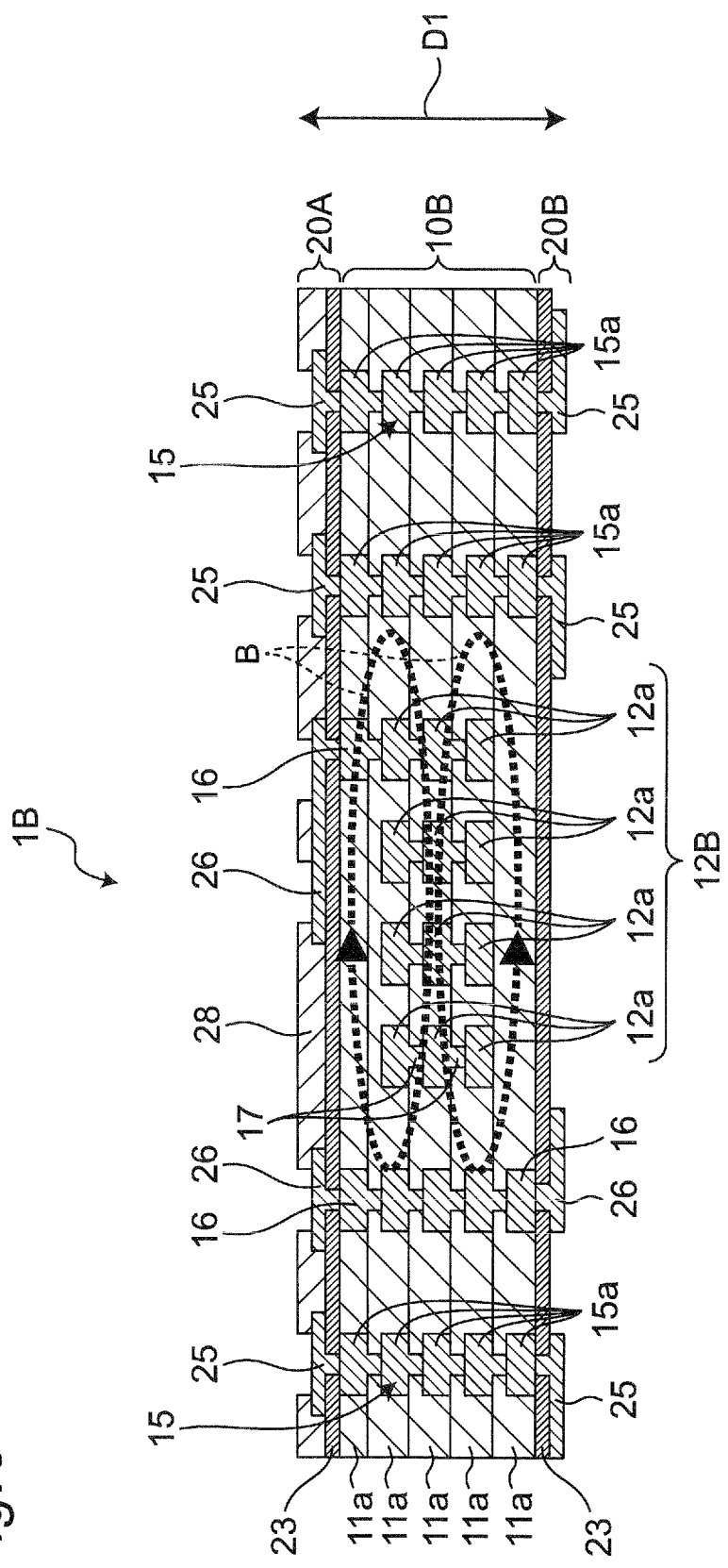
FIG. 6 is a cross-sectional view of a third embodiment of the printed wiring board.

FIG. 6 is a cross-sectional view of a third embodiment of a printed wiring board. The third embodiment is different from the first embodiment only in the configuration of the coil. Only this different configuration will hereinafter be described. In the third embodiment, the same constituent elements as the first embodiment are denoted by the same reference numerals as the first embodiment and therefore will not be described.

As shown in FIG. 6, in a printed wiring board 1B of the third embodiment, the shape of a coil 12B is a helical shape. The axis of the coil 12B coincides with a direction orthogonal to the first direction D1. The "helical shape" is a helix (three-dimensional helix) advancing in an axial direction while maintaining substantially the same diameter. Specifically, the coil 12B is made up of the three-layer coil pattern part 12a. The three-layer coil pattern part 12a is laminated along the first direction D1. The three layers of the coil pattern part 12a are connected via the coil via part 17. A core base material 10B has a closed magnetic circuit in which the magnetic flux of the coil 12B circulates as indicated by the arrows B.

In the third embodiment, in addition to the effects of the first embodiment, the coil 12B can be configured as a laminated inductor that can be reduced in thickness and size. The coil may be made up of the coil pattern part having four or more layers.

Fourth Embodiment

Figure 7:
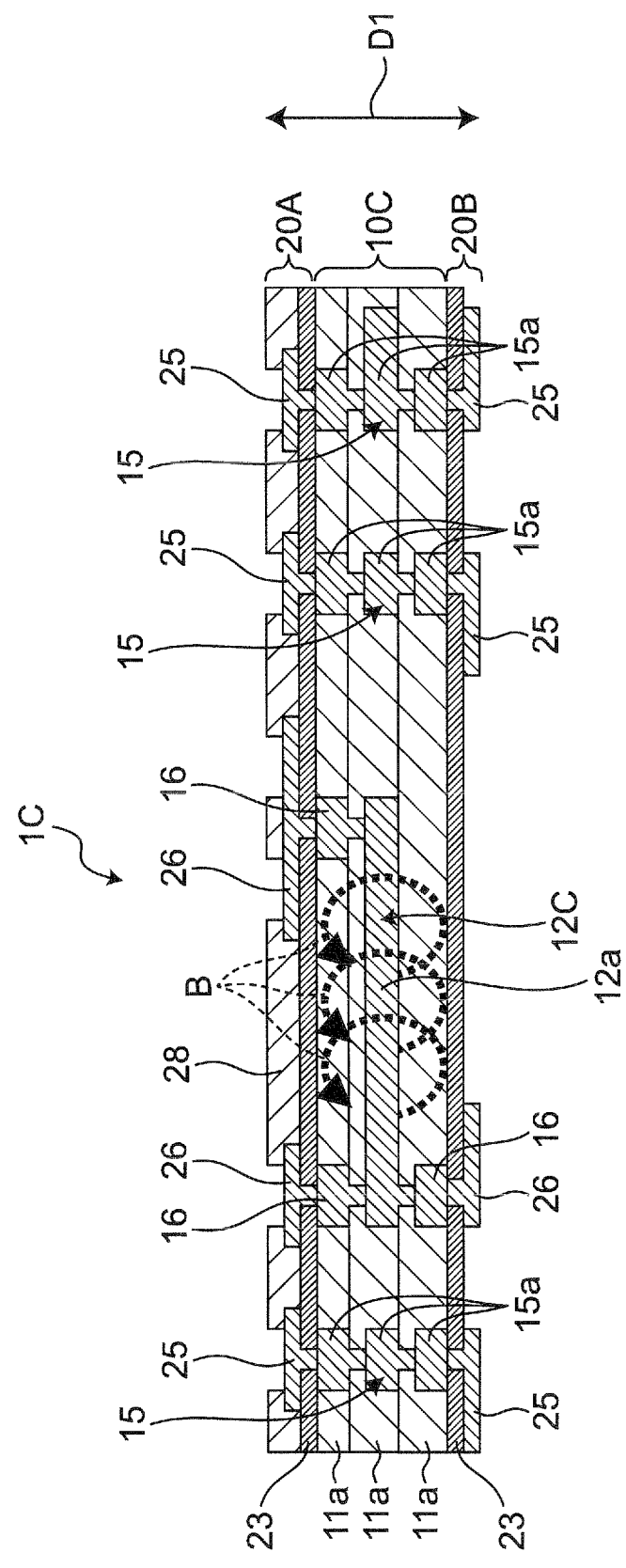
FIG. 7 is a cross-sectional view of a fourth embodiment of the printed wiring board.

FIG. 7 is a cross-sectional view of a fourth embodiment of a printed wiring board. The fourth embodiment is different from the first embodiment only in the configuration of the coil. Only this different configuration will hereinafter be described. In the fourth embodiment, the same constituent elements as the first embodiment are denoted by the same reference numerals as the first embodiment and therefore will not be described.

As shown in FIG. 7, in a printed wiring board 1C of the fourth embodiment, the shape of a coil 12C is a linear shape. The coil 12C extends in a direction orthogonal to the first direction D1. Specifically, the coil 12C is made up of the single-layer coil pattern part 12a. A core base material 10C has a closed magnetic circuit in which the magnetic flux of the coil 12C circulates as indicated by the arrows B. Even if the coil 12C has a linear shape, the coil is formed inside the core base material 10C having the magnetic material layer 11a so that a relatively large inductance can be ensured. In the fourth embodiment, in addition to the effects of the first embodiment, the coil 12C can be configured as a laminated inductor that can be reduced in thickness and size.

Fifth Embodiment

Figure 8:
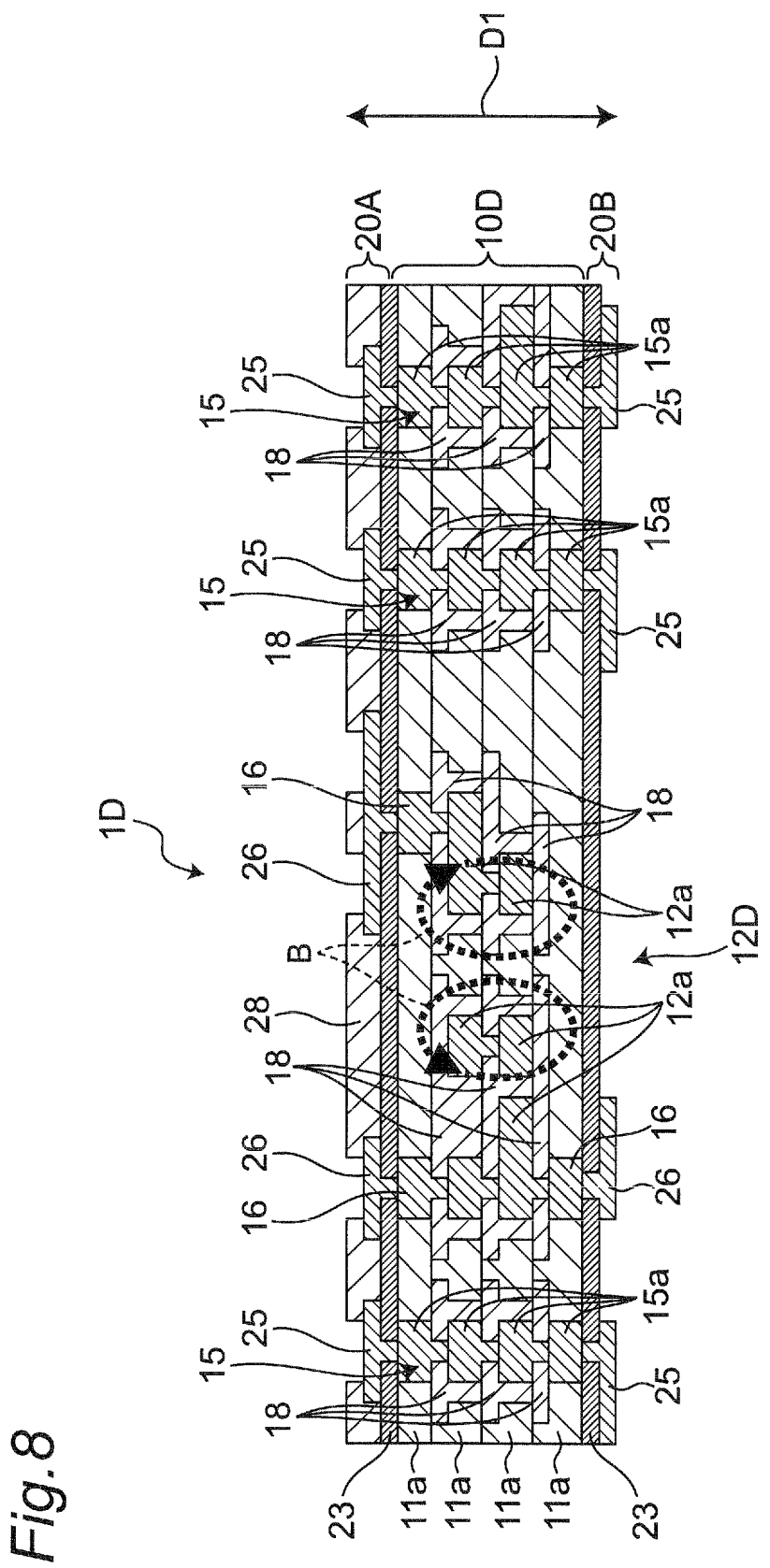
FIG. 8 is a cross-sectional view of a fifth embodiment of the printed wiring board.

FIG. 8 is a cross-sectional view of a fifth embodiment of a printed wiring board. The fifth embodiment is different from the second embodiment only in the configuration of the coil. Only this different configuration will hereinafter be described. In the fifth embodiment, the same constituent elements as the second embodiment are denoted by the same reference numerals as the second embodiment and therefore will not be described.

As shown in FIG. 8, in a printed wiring board 1D of the fifth embodiment, a coil 12D includes the coil pattern part 12a (conductive part) having conductivity and an insulating film 18 covering the coil pattern part 12a. Since the coil pattern part 12a is covered by the insulating film 18, the coil 12D can prevent an electric leakage from the coil 12D to a core base material 10D including the magnetic material layer 11a. Furthermore, in the printed wiring board 1D, the internal board wiring 15 (the wiring pattern parts 15a) in the same layer as the coil pattern part 12a is also covered by the insulating film 18. This can prevent an electric leakage from the internal board wiring 15 to the core base material 10D including the magnetic material layer 11a.

The insulating film 18 is made of a composite material of an insulating non-magnetic filler and a resin, for example. The insulating non-magnetic filler is a silica filler, for example, and the resin is a resin material such as epoxy, for example. As a result, the insulation can inexpensively be ensured.

In the fifth embodiment, as in the second embodiment, since the external circuit layers 20A, 20B are directly disposed on the core base material 10D, a conventional mounting board is not required, and the thickness of the printed wiring board 1D can be reduced. The coil may be made up of the coil pattern part having one layer or three or more layers and, in this case, the coil pattern part is covered with an insulating film.

A manufacturing method of the printed wiring board 1D will be described.

Figure 9A:
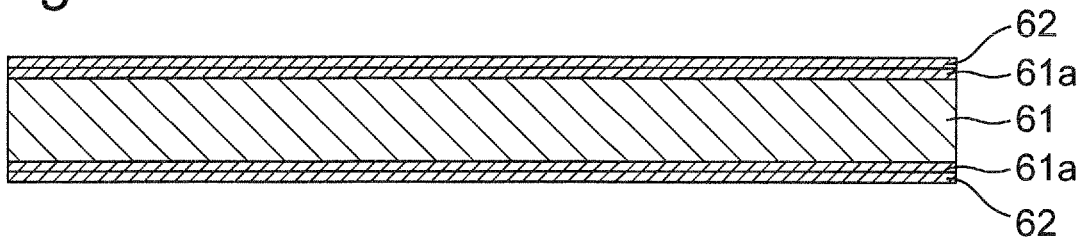
FIG. 9A is an explanatory view for explaining a manufacturing method of the fifth embodiment of the printed wiring board.

As shown in FIG. 9A, the dummy core substrate 61 is prepared. The dummy core substrate 61 has the substrate copper foil 61a on both sides. In this example, the dummy core substrate 61 is a glass epoxy substrate.

The copper foil 62 is then bonded onto the surface of the substrate copper foil 61a. The copper foil 62 is bonded to a smooth surface of the substrate copper foil 61a. Therefore, an adhesion force can be made weak between the copper foil 62 and the substrate copper foil 61a and, at a subsequent step, the dummy core substrate 61 can easily be peeled from the copper foil 62. Preferably, an adhesive bonding the dummy core substrate 61 and the copper foil 62 is an adhesive with low tackiness. For weakening of the adhesion force between the dummy core substrate 61 and the copper foil 62, it is desirable that the bonding surfaces of the dummy core substrate 61 and the copper foil 62 are glossy surfaces.

Although the subsequent processes can be performed on both sides of the dummy core substrate 61, the processes are performed only on the upper surface in this example for simplicity of description.

Figure 9B:
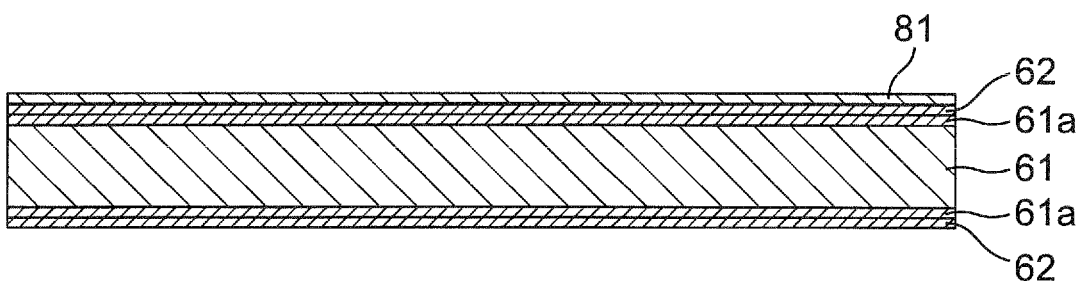
FIG. 9B is an explanatory view for explaining the manufacturing method of the fifth embodiment of the printed wiring board.

As shown in FIG. 9B, an insulating sheet is laminated on the copper foil 62 by using a laminator etc. and then cured to form an insulating layer 81 serving as an insulating film.

Figure 9C:
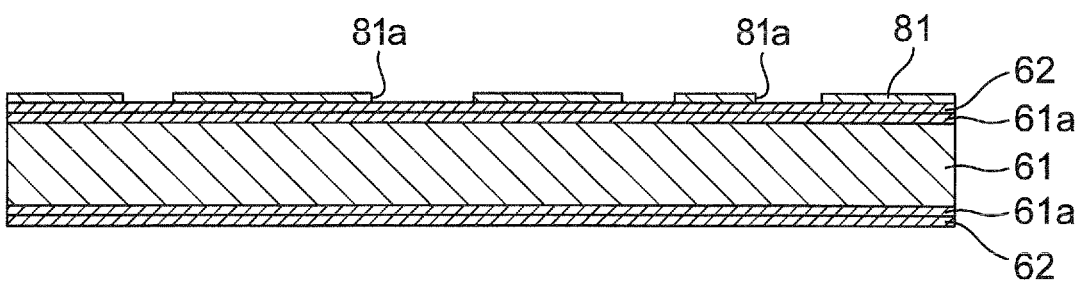
FIG. 9C is an explanatory view for explaining the manufacturing method of the fifth embodiment of the printed wiring board.

As shown in FIG. 9C, an opening portion 81a is formed in the insulating layer 81 by laser processing etc.

Figure 9D:
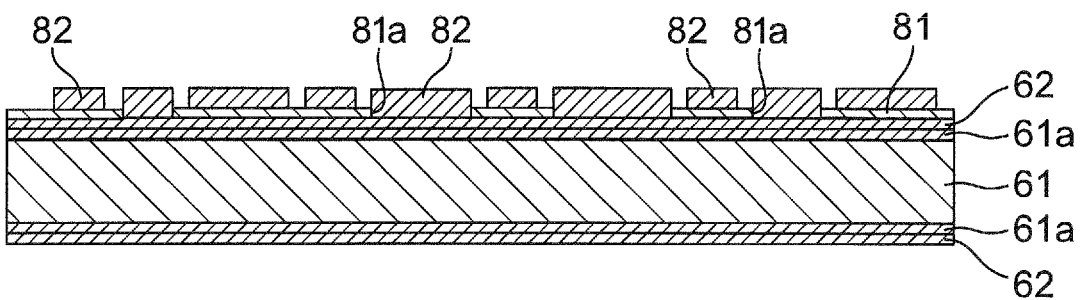
FIG. 9D is an explanatory view for explaining the manufacturing method of the fifth embodiment of the printed wiring board.
Figure 9E:
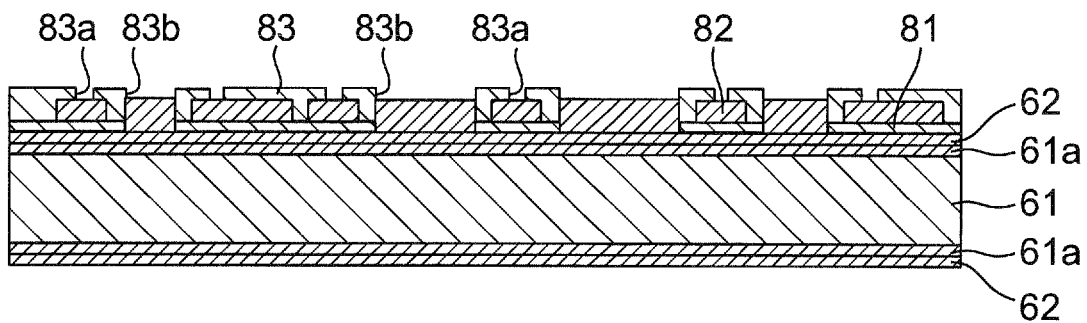
FIG. 9E is an explanatory view for explaining the manufacturing method of the fifth embodiment of the printed wiring board.

As shown in FIG. 9D, after electroless copper is formed on the entire surface, a conductor layer 82 serving as a coil and an internal board wiring is patterned by a photolithography process and formed by electroplating etc. As shown in FIG. 9E, an insulating layer 83 is formed on the pattern as in FIG. 9B, and a connection via 83a to the coil and the internal board wiring and an opening portion 83b for a magnetic path are disposed.

Figure 9F:
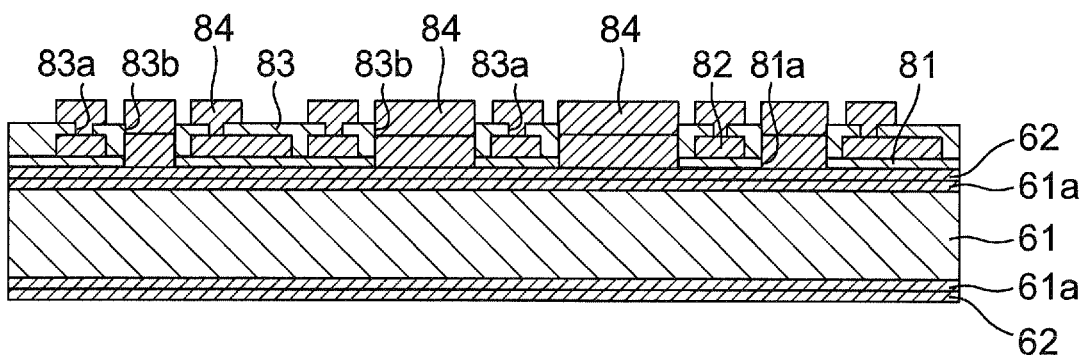
FIG. 9F is an explanatory view for explaining the manufacturing method of the fifth embodiment of the printed wiring board.
Figure 9G:
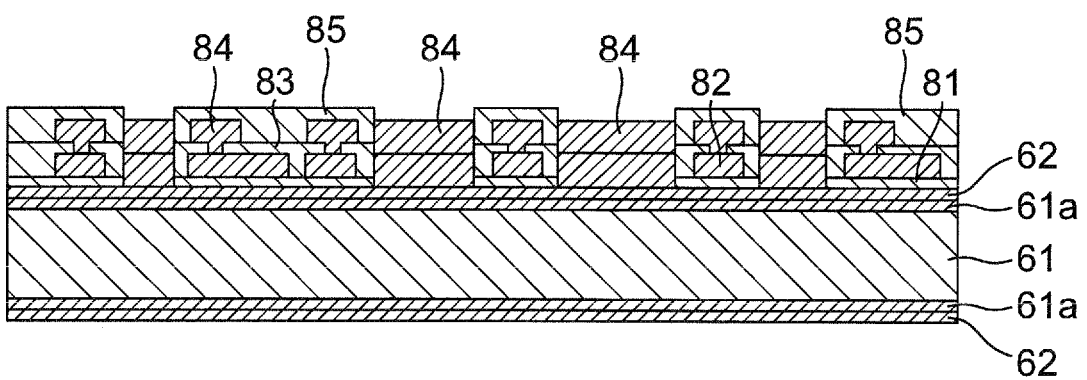
FIG. 9G is an explanatory view for explaining the manufacturing method of the fifth embodiment of the printed wiring board.

As shown in FIG. 9F, a conductor layer 84 is formed on the pattern as in FIG. 9C. As shown in FIG. 9G, after an insulating layer 85 is formed on the pattern as in FIG. 9B, the insulating layer 85 in a portion serving as a magnetic path is removed by a laser etc.

Figure 9H:
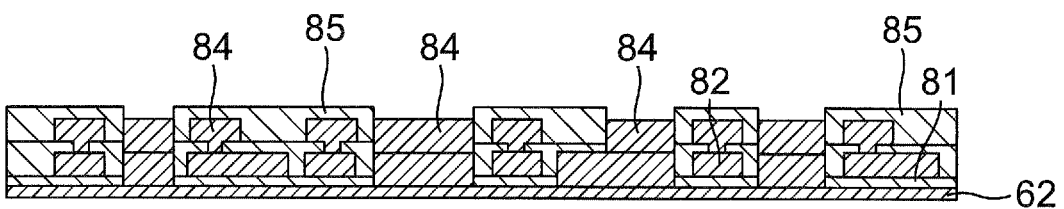
FIG. 9H is an explanatory view for explaining the manufacturing method of the fifth embodiment of the printed wiring board.
Figure 9I:
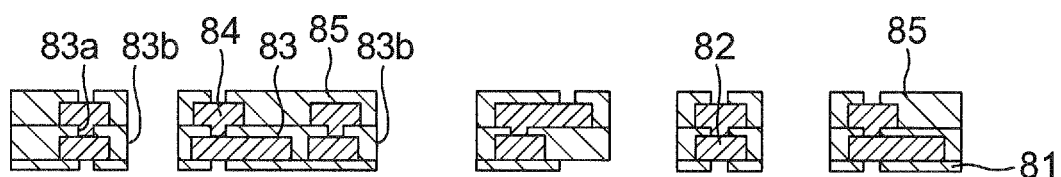
FIG. 9I is an explanatory view for explaining the manufacturing method of the fifth embodiment of the printed wiring board.

As shown in FIG. 9H, the dummy core substrate 61 is peeled and removed at an interface with the copper foil 62. As shown in FIG. 9I, the copper foil 62 is removed by etching. At this step, the conductor layers 82, 84 in a portion serving as a magnetic path are simultaneously removed.

Figure 9J:
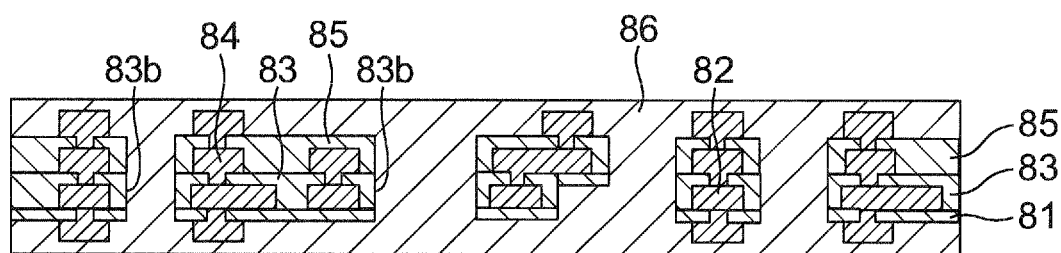
FIG. 9J is an explanatory view for explaining the manufacturing method of the fifth embodiment of the printed wiring board.
Figure 9K:
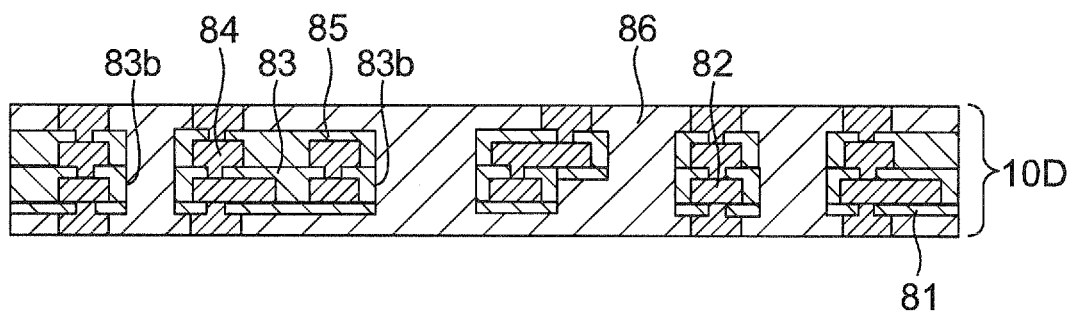
FIG. 9K is an explanatory view for explaining the manufacturing method of the fifth embodiment of the printed wiring board.

As shown in FIG. 9J, a magnetic sheet is pressed from both sides to form a magnetic material layer 86. As shown in FIG. 9K, grinding and polishing of the upper and lower surfaces are performed by a back grinder, a buff roll, etc. to acquire the desired core base material 10D.

Subsequently, the external circuit layers 20A, 20B are formed as in FIGS. 4M to 4P to manufacture the printed wiring board 1D shown in FIG. 8.

The present disclosure is not limited to the embodiments described above and may be changed in design without departing from the spirit of the present disclosure. For example, respective feature points of the first to fifth embodiments may variously be combined.

Although the external circuit layers are disposed on both the first and second surfaces of the core base material in the embodiments, an external circuit layer may be disposed on at least one of the first and second surfaces of the core base material. Although the external circuit layer includes only one layer provided with the external board wiring in the embodiments, the external circuit layer may include multiple layers provided with the external board wiring, and the thickness of the external circuit layer may be changed depending on a required circuit configuration.

Although both ends of the coil are electrically connected to the external circuit layer in the embodiments, at least one end of the coil may electrically be connected to a portion of the external circuit layer. Although the coil is a laminated inductor having the coil made up of the coil pattern parts and the coil via parts in the embodiments, the coil may be a copper line or a copper line (wire) with an insulation coating.

Although the printed wiring board is used as a circuit board for a switching regulator in the embodiments, the board may be used as a board for other circuits. The printed wiring board may be used as a substrate or an interposer for mounting an IC chip inside an IC package. In this case, since the printed wiring board can be made thin, the IC package can be made small. Additionally, since the printed wiring board includes the core base material containing a magnetic material, propagation of electric and magnetic noises can be suppressed between the built-in coil and other electric elements and between electric elements across the core base material so as to reduce malfunctions and magnetic losses of an electric circuit.

What is claimed is:

1. A printed wiring board comprising:
   a sheet-shaped core base material containing a magnetic material;
   a coil which is a single-layer pattern having a straight line shape that is disposed inside a single magnetic material layer of the sheet-shaped core base material; and
   an external circuit layer disposed on at least one of first and second surfaces of the core base material opposite to each other.

2. The printed wiring board according to claim 1, wherein the external circuit layer includes an external board wiring not connected to the coil.

3. The printed wiring board according to claim 2, wherein the external circuit layer includes an external insulating layer laminated on the first surface or the second surface of the core base material.

4. The printed wiring board according to claim 1, wherein the core base material has a closed magnetic circuit in which a magnetic flux generated by the coil circulates.

5. The printed wiring board according to claim 1, wherein the external circuit layer includes an external insulating layer laminated on the first surface or the second surface of the core base material.

6. The printed wiring board according to claim 5, wherein the external insulating layer contains a glass cloth.

7. The printed wiring board according to claim 5, wherein the core base material is made of a composite material of a metal magnetic filler and a resin.

8. The printed wiring board according to claim 5, wherein the coil is made of a material containing Cu.

9. The printed wiring board according to claim 1, wherein the coil has a conductive part and an insulating film covering the conductive part.

10. The printed wiring board according to claim 9, wherein the insulating film is made of a composite material of an insulating non-magnetic filler and a resin.

11. The printed wiring board according to claim 1, wherein at least one end of the coil is electrically connected to a portion of the external circuit layer.

12. The printed wiring board according to claim 1, further comprising an internal board wiring disposed inside the core base material and not connected to the coil.

13. The printed wiring board according to claim 12, wherein the internal board wiring includes multiple wiring pattern parts linearly extending along the first surface or the second surface, and a wiring via part penetrating the core base material between the multiple wiring pattern parts along a first direction in which the first surface and the second surface are opposite.

14. The printed wiring board according to claim 13, wherein the internal board wiring has a portion conducting from the first surface to the second surface along the first direction.

15. The printed wiring board according to claim 14, wherein:
   the external circuit layer is disposed on each of the first and second surfaces of the core base material; and
   the internal board wiring includes a portion electrically connecting the external circuit layer disposed on the first surface and the external circuit layer disposed on the second surface.

16. A switching regulator comprising:
   the printed wiring board according to claim 1; and
   a capacitor and a switching element electrically connected via the external circuit layer to the coil of the printed wiring board.

* * * * *